US011527681B2

(12) United States Patent
Lee

(10) Patent No.: US 11,527,681 B2
(45) Date of Patent: Dec. 13, 2022

(54) SEMICONDUCTOR DEVICE PACKAGE

(71) Applicant: SUZHOU LEKIN SEMICONDUCTOR CO., LTD., Taicang (CN)

(72) Inventor: Koh Eun Lee, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 88 days.

(21) Appl. No.: 17/059,889

(22) PCT Filed: May 31, 2019

(86) PCT No.: PCT/KR2019/006587
§ 371 (c)(1),
(2) Date: Nov. 30, 2020

(87) PCT Pub. No.: WO2019/231283
PCT Pub. Date: Dec. 5, 2019

(65) Prior Publication Data
US 2021/0217932 A1 Jul. 15, 2021

(30) Foreign Application Priority Data

Jun. 1, 2018 (KR) .................. 10-2018-0063405

(51) Int. Cl.
H01L 33/48 (2010.01)
H01L 33/60 (2010.01)
(Continued)

(52) U.S. Cl.
CPC ........... *H01L 33/486* (2013.01); *H01L 33/60* (2013.01); *H01L 33/62* (2013.01); *H01L 33/28* (2013.01); *H01L 33/32* (2013.01)

(58) Field of Classification Search
CPC .................. H01L 33/486; H01L 33/62
See application file for complete search history.

(56) References Cited

U.S. PATENT DOCUMENTS

2004/0079957 A1 4/2004 Andrews et al.
2012/0296319 A1 11/2012 Lee et al.
2016/0133810 A1* 5/2016 Jung .................. H01L 33/32
257/13

FOREIGN PATENT DOCUMENTS

KR 10-2014-0069624 A 6/2014
KR 10-2018-0044251 A 5/2018
(Continued)

*Primary Examiner* — Marcos D. Pizarro
*Assistant Examiner* — Antonio B Crite
(74) *Attorney, Agent, or Firm* — Birch, Stewart, Kolasch & Birch, LLP

(57) ABSTRACT

Disclosed in an embodiment is a semiconductor device package comprising: a body comprising a cavity; a semiconductor device disposed within the cavity; and a light transmission member disposed on an upper portion of the cavity, wherein the body comprises a first conductive part and a second conductive part disposed to be spaced apart from each other in a first direction, a first insulating part disposed between the first conductive part and the second conductive part, and a second insulating part disclosed in an edge region where a lower surface and side surfaces of the body meet, wherein the cavity comprises a stepped portion on which the light transmission member is disposed, and wherein the second insulating part overlaps with the stepped portion in a vertical direction of the body.

20 Claims, 7 Drawing Sheets

(51) Int. Cl.
*H01L 33/62* (2010.01)
*H01L 33/28* (2010.01)
*H01L 33/32* (2010.01)

(56) References Cited

FOREIGN PATENT DOCUMENTS

KR  10-2018-0053284 A  5/2018
WO  WO 2017/061955 A1  4/2017

\* cited by examiner

[FIG. 1]
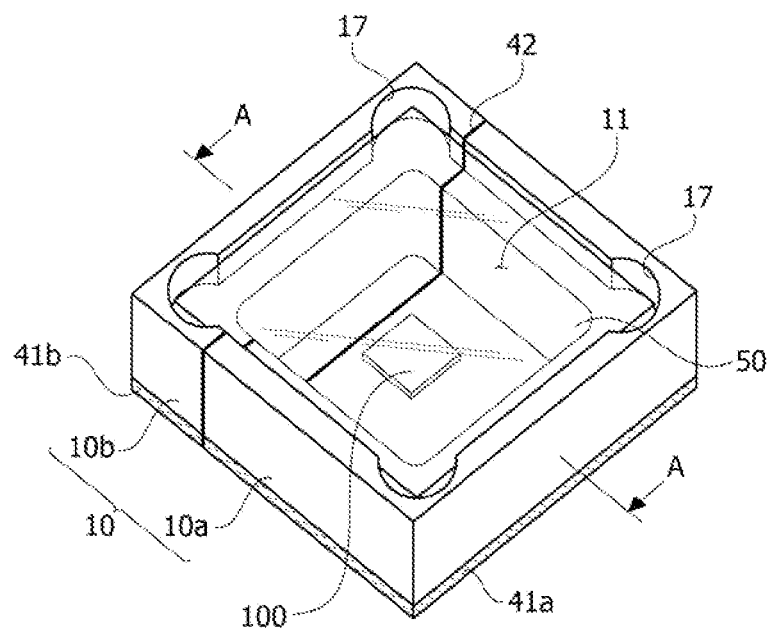
[FIG. 2]
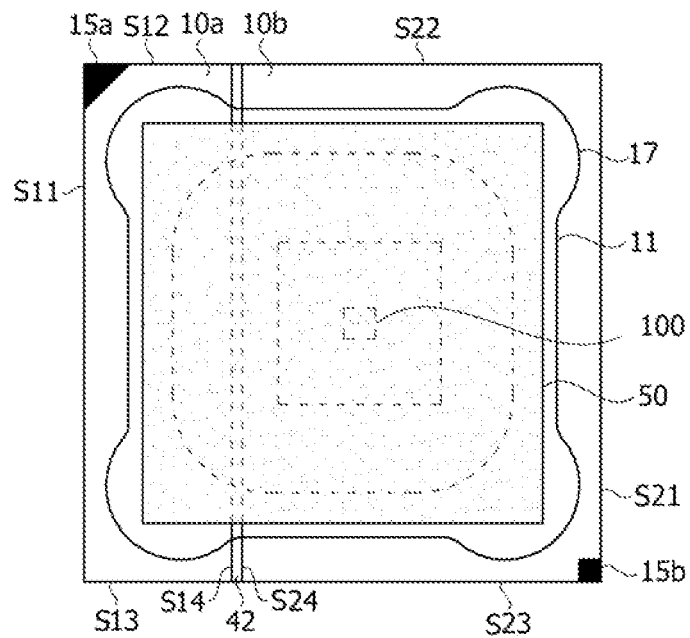

[FIG. 3A]
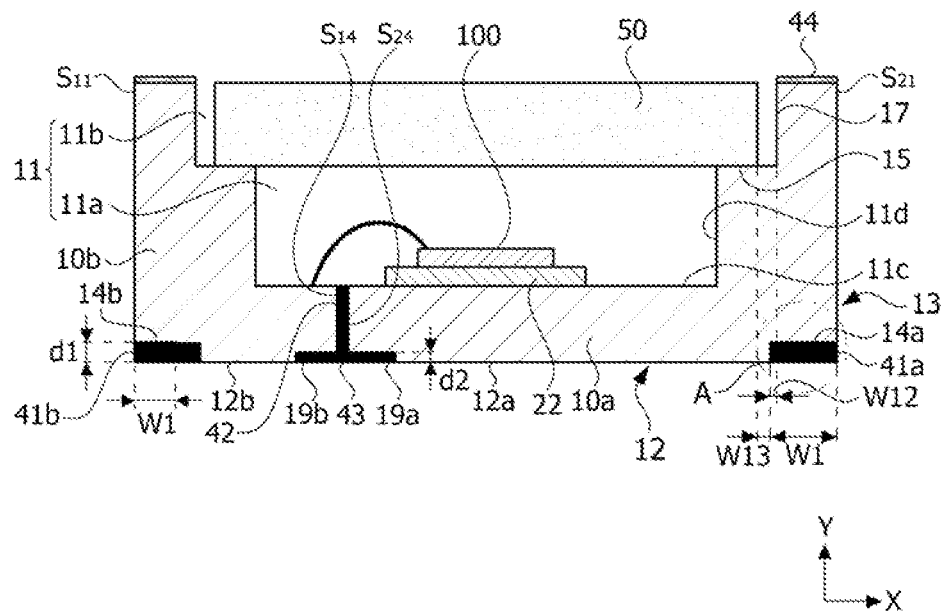
[FIG. 3B]
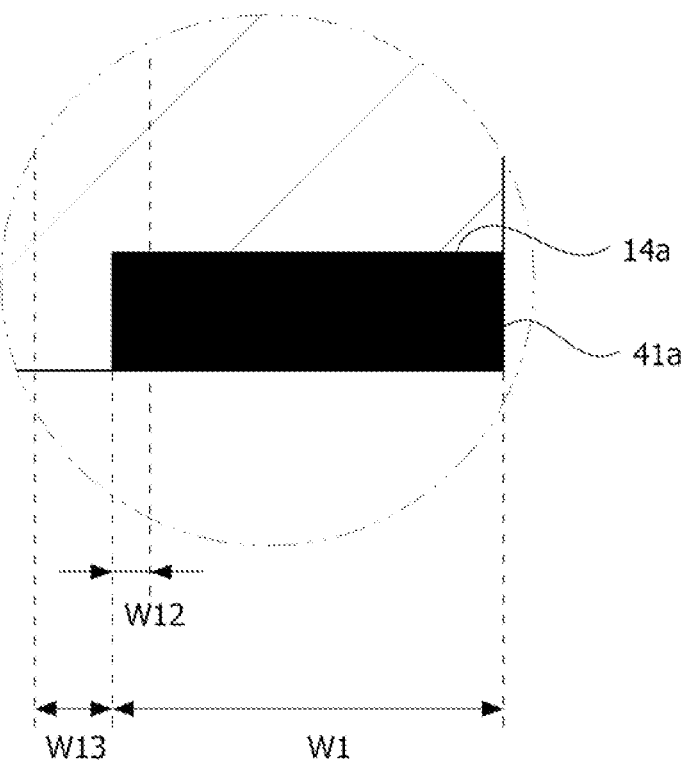

[FIG. 4]
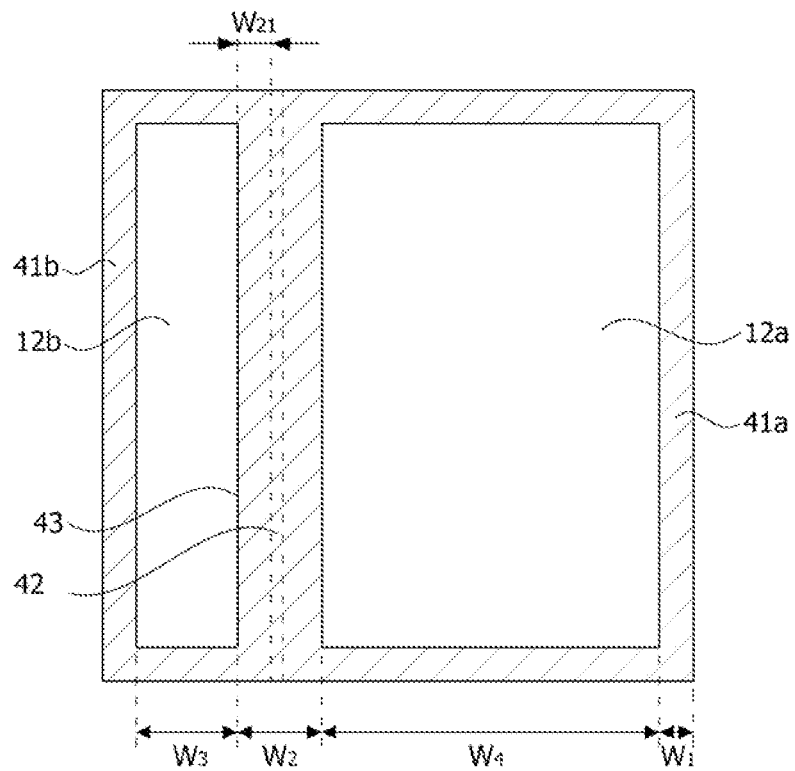
[FIG. 5]
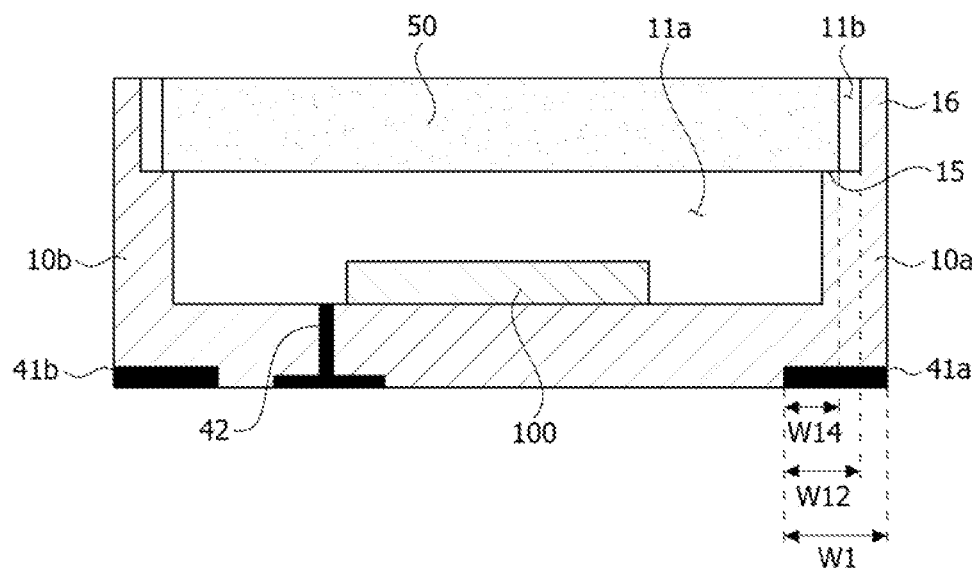

[FIG. 6]
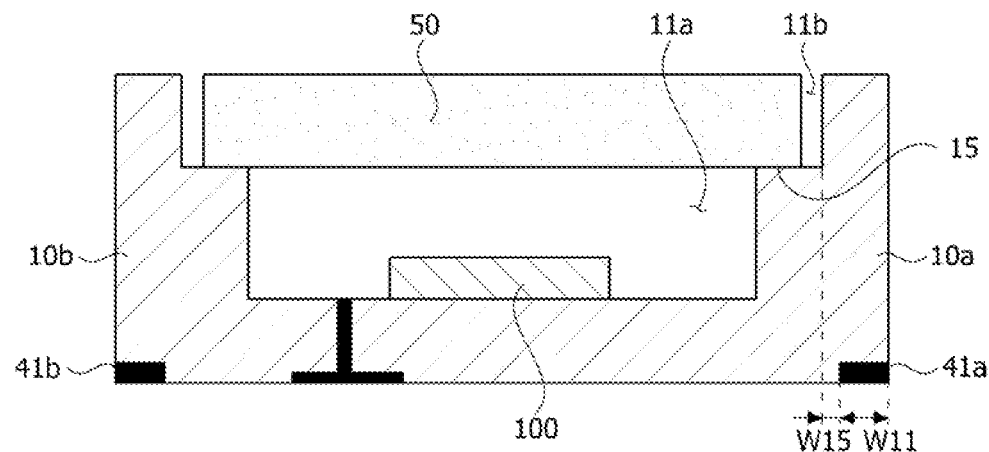
[FIG. 7]
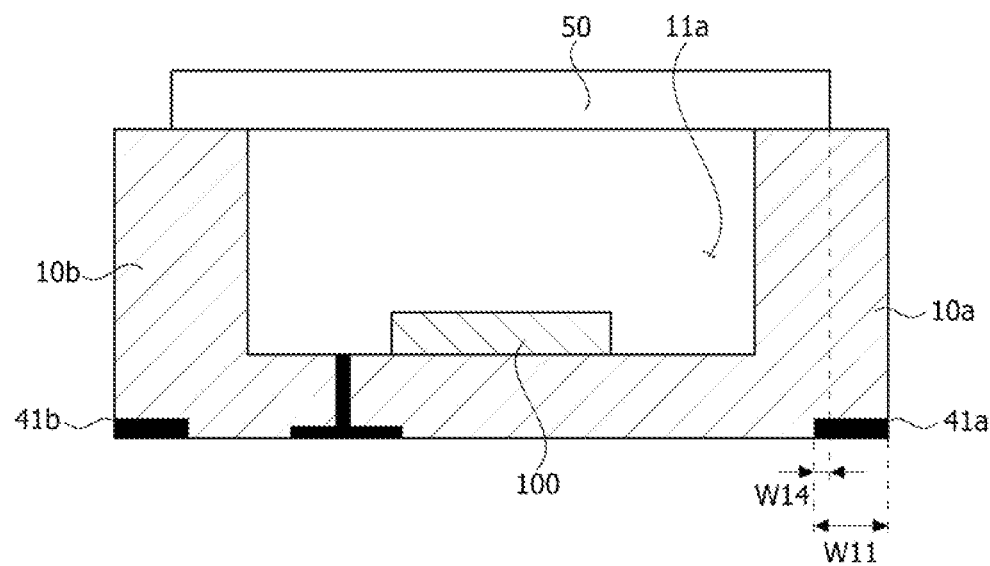

[FIG. 8]
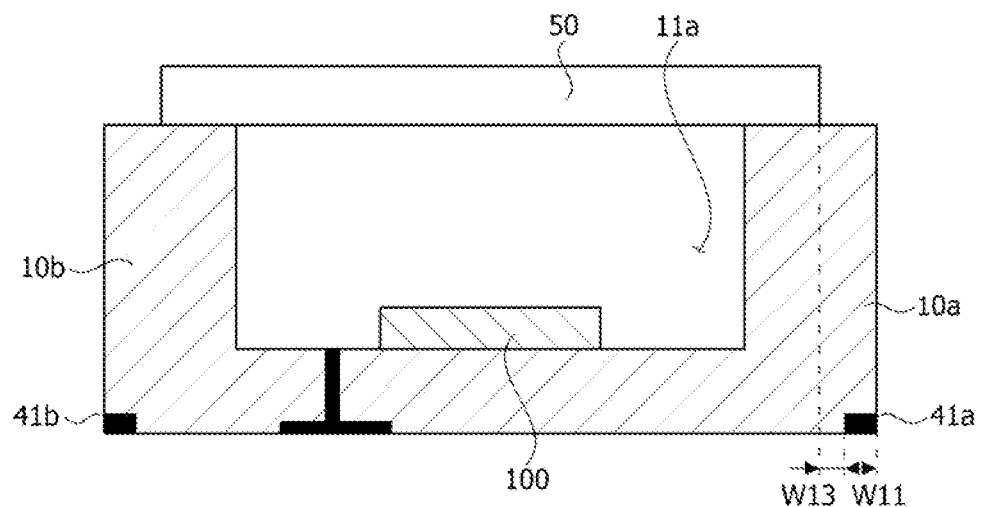
[FIG. 9]
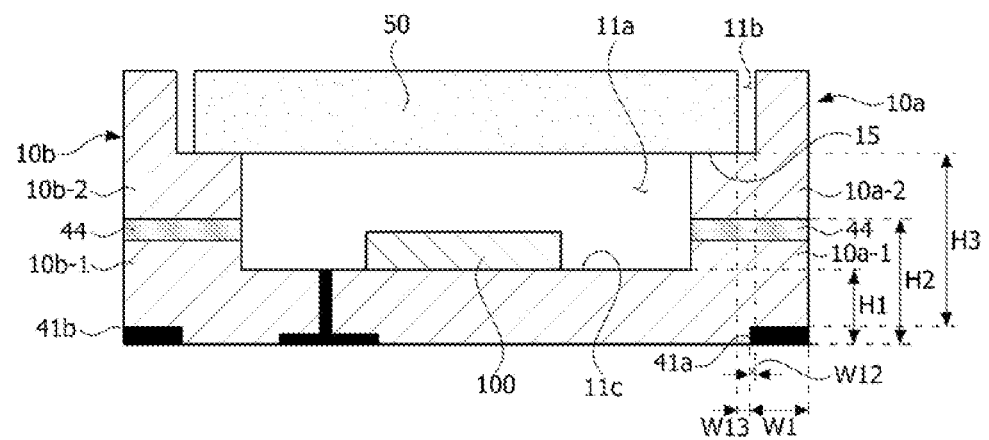

[FIG. 10]
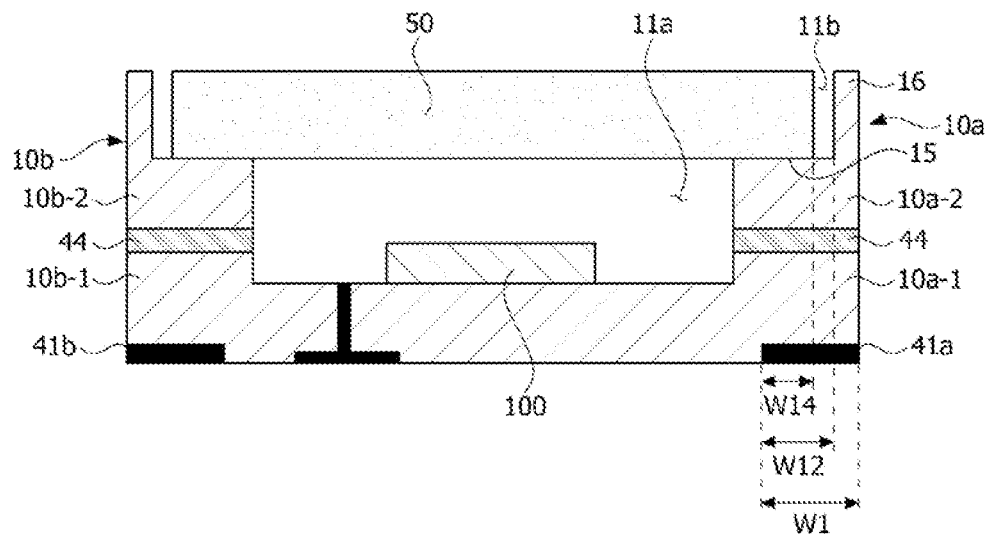
[FIG. 11]
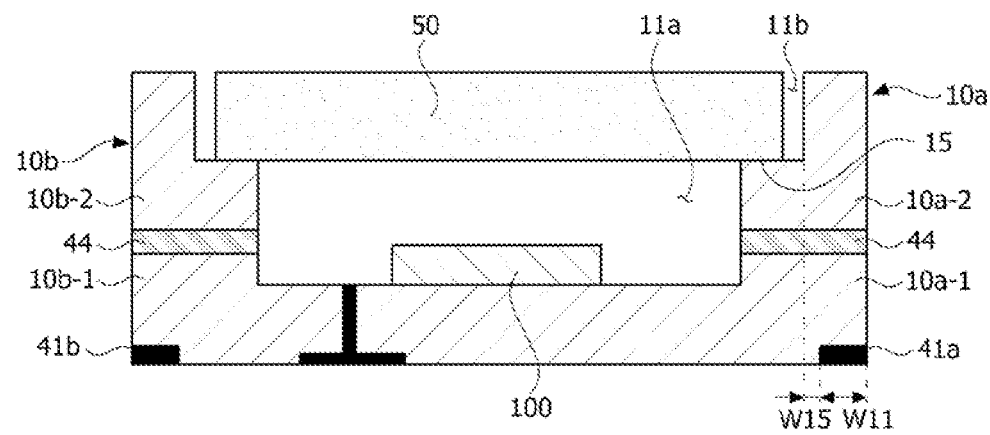

[FIG. 12]
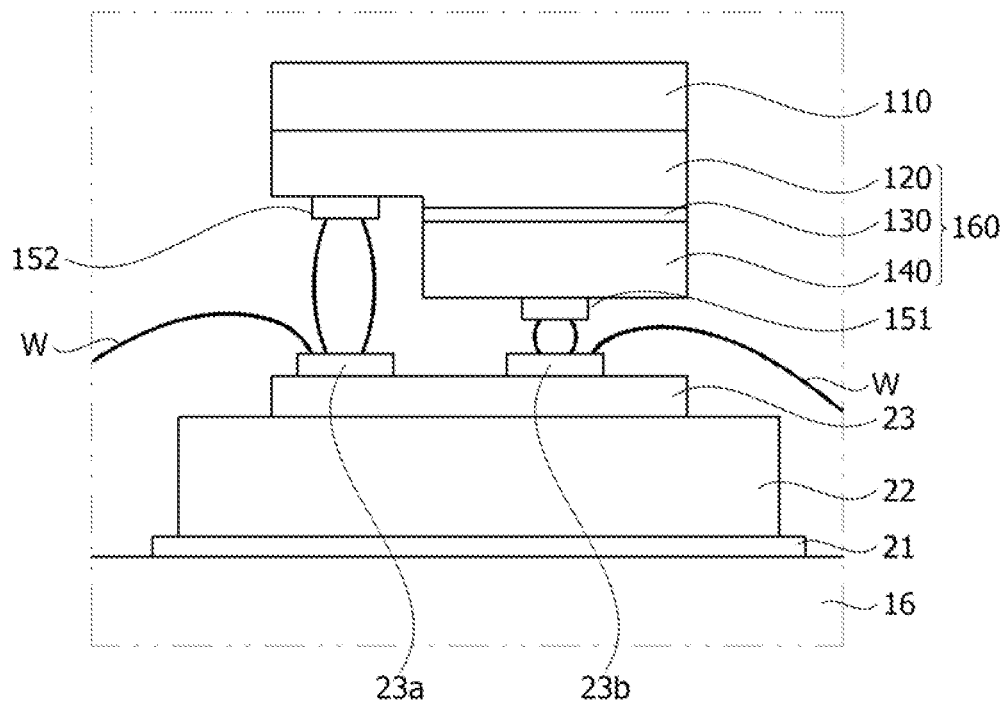
[FIG. 13]
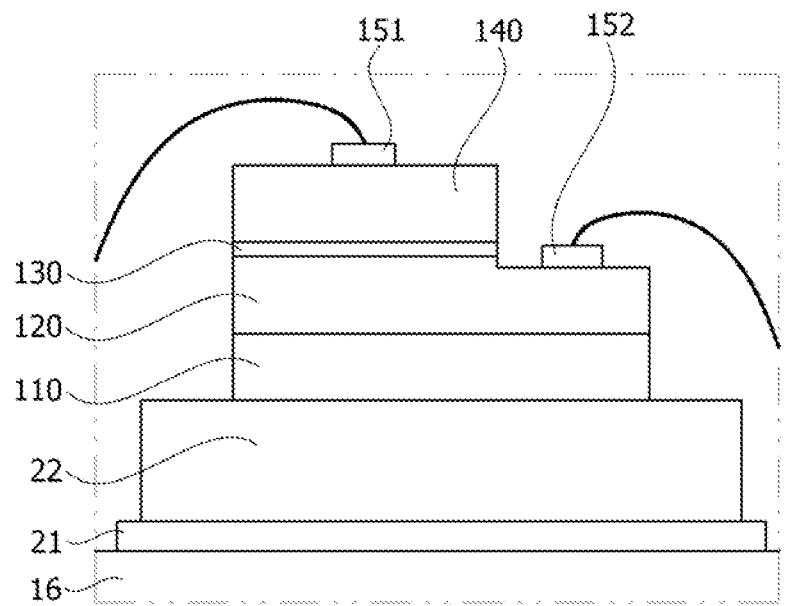

SEMICONDUCTOR DEVICE PACKAGE

CROSS REFERENCE TO RELATED APPLICATIONS

This application is the National Phase of PCT/KR2019/006587 filed on May 31, 2019, which claims priority under 35 U.S.C. § 119(a) to Patent Application No. 10-2018-0063405 filed in the Republic of Korea on Jun. 1, 2018, all of which are hereby expressly incorporated by reference into the present application.

TECHNICAL FIELD

Embodiments relate to a semiconductor device package.

BACKGROUND ART

A light emitting device including a compound such as GaN, AlGaN, or the like has many advantages such as having wide and easily adjustable band gap energy, and thus can be variously used as a light emitting device, a light receiving device, various diodes, and the like.

Specifically, a light emitting device such as a light emitting diode or laser diode using group III-V or II-VI compound semiconductor materials can implement various colors such as red, green, blue, ultraviolet rays, and the like through the development of thin film growth technology and device materials, can implement white light with good efficiency by using fluorescent materials or combining colors, and has advantages of low power consumption, semi-permanent lifespan, quick response time, safety, environmental friendliness, and the like in comparison with conventional light sources such as a fluorescent lamp, an incandescent lamp, and the like.

Further, when a light receiving device such as a photodetector or solar cell is also manufactured using group III-V or II-VI compound semiconductor materials, due to the development of device materials, light in various wavelength ranges from a gamma ray range to a radio wavelength range can be used by absorbing light in various wavelength ranges and generating a photocurrent. In addition, the light receiving device has advantages of quick response time, safety, environmental friendliness, and easy adjustment of the device materials, and thus can be easily used for power control, ultra-high frequency circuits, or communication modules.

Accordingly, application of the light emitting device is being expanded to a transmission module of an optical communication means, a light emitting diode backlight replacing a cold cathode fluorescence lamp (CCFL) that constitutes a backlight of a liquid crystal display (LCD) device, a white light emitting diode lighting device capable of replacing a fluorescent or an incandescent bulb, car headlights, traffic lights, sensors which sense gas or fire, and the like. Further, the application of the light emitting device can be expanded to a high frequency application circuit, other power control devices, and communication modules.

Specifically, a light emitting device which emits light in an ultraviolet wavelength range can be used for curing, medical, and sterilizing purposes by performing a curing or sterilizing action.

Although research on an ultraviolet (UV) semiconductor device package is active recently, an UV semiconductor device still has problems in which light extraction efficiency is relatively low, and inner heat cannot be effectively dissipated to the outside.

SUMMARY

An embodiment is directed to providing a semiconductor device package having excellent heat dissipation.

An embodiment is directed to providing a semiconductor device package having excellent light extraction efficiency.

An embodiment is directed to providing a semiconductor device package capable of suppressing a burr generated during package cutting.

An embodiment is directed to providing a light emitting device package in which an upper portion of a package body is disposed to be insulated from a lower portion.

Problems to be solved by the present invention are not limited to the above-described problems, and purposes and effects understood from solutions and embodiments which will be described below are also included.

One aspect of the present invention provides a semiconductor device package including: a body including a cavity; a semiconductor device disposed in the cavity; and a light transmission member disposed on the cavity, wherein the body includes a first conductive part and a second conductive part disposed to be spaced apart from each other in a first direction, a first insulating part disposed between the first conductive part and the second conductive part, and a second insulating part disposed in an edge region where a lower surface and side surfaces of the body meet, the cavity includes a stepped portion on which the light transmission member is disposed, and the second insulating part overlaps the stepped portion in a vertical direction of the body.

A width in the first direction in which the second insulating part and the stepped portion overlap each other may be 10% to 30% of a width of the second insulating part in the first direction.

The second insulating part may overlap the light transmission member in the vertical direction.

A width in the first direction in which the second insulating part and the light transmission member overlap each other may be 5% to 50% of the width of the second insulating part in the first direction.

The second insulating part may not overlap the light transmission member in the vertical direction.

A separation distance between the second insulating part and the light transmission member in the first direction may be 5% to 10% of the width of the second insulating part in the first direction.

The first conductive part may include a first lower conductive part and a first upper conductive part, the second conductive part may include a second lower conductive part and a second upper conductive part, and the body may include fourth insulating parts disposed between the first lower conductive part and the first upper conductive part, and between the second lower conductive part and the second upper conductive part.

A vertical distance from the lower surface of the body to the fourth insulating part may be greater than a vertical distance from the lower surface of the body to a bottom surface of the cavity.

A lower surface of the first conductive part may be wider than a lower surface of the second conductive part.

A thickness of the second insulating part may be 5% to 10% of a height of the body.

Advantageous Effects

According to an embodiment, the heat dissipation efficiency of a semiconductor device package can be enhanced.

Further, a burr generated during package cutting can be suppressed.

In addition, the light extraction efficiency can be enhanced.

In addition, since an upper portion and a lower portion of a package body are disposed to be insulated, a short circuit can be suppressed even when water or chemicals come into contact with the upper portion.

Various useful advantages and effects of the present invention are not limited to the above and may be relatively easily understood in a process of describing exemplary embodiments of the present invention.

BRIEF DESCRIPTION OF THE DRAWINGS

FIG. 1 is a perspective view of a semiconductor device package according to a first embodiment of the present invention.

FIG. 2 is a plan view of the semiconductor device package according to the first embodiment of the present invention.

FIG. 3A is a cross-sectional view of the semiconductor device package according to the first embodiment of the present invention.

FIG. 3B is an enlarged view of portion A in FIG. 3A.

FIG. 4 is a bottom view of the semiconductor device package according to the first embodiment of the present invention.

FIG. 5 is a cross-sectional view of a semiconductor device package according to a second embodiment of the present invention.

FIG. 6 is a cross-sectional view of a semiconductor device package according to a third embodiment of the present invention.

FIG. 7 is a cross-sectional view of a semiconductor device package according to a fourth embodiment of the present invention.

FIG. 8 is a cross-sectional view of a semiconductor device package according to a fifth embodiment of the present invention.

FIG. 9 is a cross-sectional view of a semiconductor device package according to a sixth embodiment of the present invention.

FIG. 10 is a cross-sectional view of a semiconductor device package according to a seventh embodiment of the present invention.

FIG. 11 is a cross-sectional view of a semiconductor device package according to an eighth embodiment of the present invention.

FIG. 12 is a conceptual diagram of a semiconductor device.

FIG. 13 is a modified example of FIG. 12.

DETAILED DESCRIPTION

The embodiments may be modified into other forms or some of the embodiments may be combined, and the scope of the present invention is not limited to embodiments which will be described below.

Although items described in a specific embodiment are not described in another embodiment, the items may be understood as a description related to the other embodiment unless a description contrary to or contradicting the items is in the other embodiment.

For example, when a characteristic of a component A is described in a specific embodiment and a characteristic of a component B is described in another embodiment, the characteristics of the components are understood to fall within the scope of the present invention unless a contrary or contradictory description is present even when an embodiment in which the component A and the component B are combined is not clearly disclosed.

In the description of the embodiments, when one element is disclosed to be formed "on or under" another element, the term "on or under" includes both a case in which the two elements are in direct contact with each other and a case in which at least one other element is disposed between the two elements (indirect contact). Further, when the term "on or under" is expressed, a meaning of not only an upward direction but also a downward direction with respect to one element may be included.

Hereinafter, embodiments of the present invention will be described in detail with reference to the accompanying drawings so that those skilled in the art may easily carry out the embodiment of the present invention.

FIG. 1 is a perspective view of a semiconductor device package according to a first embodiment of the present invention, FIG. 2 is a plan view of the semiconductor device package according to the first embodiment of the present invention, FIG. 3A is a cross-sectional view of the semiconductor device package according to the first embodiment of the present invention, FIG. 3B is an enlarged view of portion A in FIG. 3A, and FIG. 4 is a bottom view of the semiconductor device package according to the first embodiment of the present invention.

Referring to FIGS. 1 and 2, the semiconductor device package according to the embodiment may include a body 10 including a cavity 11, a semiconductor device 100 disposed in the cavity 11, and a light transmission member 50 disposed on the cavity 11.

The body 10 may be manufactured by processing an aluminum substrate. Accordingly, both an inner surface and an outer surface of the body 10 according to the embodiment may have conductivity. Such a structure may have various advantages. When a non-conductive material such as AlN or $Al_2O_3$ is used as the body, since reflectivity of ultraviolet light is only 20% to 40%, there is a problem in which a separate reflective member should be disposed. Further, a separate conductive member such as a lead frame and a circuit pattern may be required. Accordingly, manufacturing costs may increase and a process may become complicated. Further, there is a problem in which a conductive member such as gold (Au) absorbs ultraviolet rays and thus light extraction efficiency decreases.

However, according to the embodiment, since the body itself is composed of aluminum, the reflectivity of the ultraviolet light is high, and thus light extraction efficiency may be increased. Further, since the body itself has conductivity, a separate circuit pattern and a lead frame may be omitted. In addition, the body is made of aluminum, heat conductivity may be excellent in a range from 140 W/m·k to 160 W/m·k. Accordingly, heat dissipation efficiency may also be enhanced.

The body 10 may include a first conductive part 10a and a second conductive part 10b. A first insulating part 42 may be disposed between the first conductive part 10a and the second conductive part 10b. Since both the first conductive part 10a and the second conductive part 10b have conductivity, it is necessary to dispose the first insulating part 42 to separate poles.

The first insulating part 42 may include all various materials having an insulating function. For example, the first insulating part 42 may include a resin such as polyimide (PI), but is not limited thereto. A thickness of the first insulating part 42 may be 10 μm to 100 μm. When the thickness is 10 µm or more, the first conductive part 10a and the second conductive part 10b may be sufficiently insulated, and when the thickness is 100 µm or less, a problem in which the size of the package increases may be improved.

The body 10 may include the cavity 11 disposed in the upper surface thereof. Further, the body 10 may include a first align mark 15a and a second align mark 15b disposed on the upper surface. The first align mark 15a and the second align mark 15b may have different shapes. For example, the first align mark 15a may have a triangular shape and the second align mark 15b may have a quadrangular shape, but are not limited thereto.

The first conductive part 10a is disposed to face the second conductive part 10b, and may include an inner side surface S14 on which the first insulating part 42 is disposed therebetween, and outer side surfaces S11, S12, and S13 constituting side surfaces of the body 10.

The second conductive part 10b is disposed to face the first conductive part 10a, and may include an inner side surface S24 on which the first insulating part 42 is disposed therebetween, and outer side surfaces S21, S22, and S23 constituting side surfaces of the body 10.

Referring to FIG. 3A, the cavity 11 may be disposed in the upper surface of the body 10 to have a bottom surface 11c and an inclined surface 11d. In this case, an upper surface of the first insulating part 42 may be exposed to the bottom surface 11c and the inclined surface 11d of the cavity 11.

The inclined surface 11d of a first cavity 11a may be disposed perpendicular to the bottom surface 11c. However, the present invention is not limited thereto, and the inclined surface 11d may be disposed to be inclined at an angle greater than 90 degrees from the bottom surface 11c to reflect light emitted from the semiconductor device 100 upward. As described above, since the body 10 is made of aluminum, an inner surface of the cavity 11 may reflect light in an ultraviolet wavelength band upward without a separate reflective member.

A second cavity 11b may be disposed on the first cavity 11a and may have a diameter in which the light transmission member 50 may be disposed. The light transmission member 50 may be supported by a stepped portion 15 formed by a diameter difference between the first cavity 11a and the second cavity 11b. The second cavity 11b may include a plurality of recesses 17 extending from an outer circumferential surface toward a corner of the body 10.

The body 10 may include first and second grooves 14a and 14b disposed at the edges where a lower surface 12 and side surfaces 13 meet, and second insulating parts 41a and 41b disposed in the first and second grooves 14a and 14b. The first and second grooves 14a and 14b may be entirely disposed along edge regions where the lower surface 12 and the side surfaces 13 of the body 10 meet.

Specifically, the body 10 may include the first groove 14a disposed in a region where a lower surface 12a of the first conductive part 10a and the outer side surface S21 meet, and the second groove 14b where a lower surface 12b of the second conductive part 10b and the outer side surface S11 meet.

The second insulating parts 41a and 41b may include a second-1 insulating part 41a disposed in the first groove 14a and a second-2 insulating part 41b disposed in the second groove 14b. In this case, the second-1 insulating part 41a and the second-2 insulating part 41b may be integrally formed.

Shapes of the first groove 14a and the second groove 14b are not specifically limited. A cross-section of each of the first groove 14a and the second groove 14b may include all of a polygonal shape, a lens shape, and the like.

The second insulating parts 41a and 41b may be formed of the same material as the first insulating part 42, but are not limited thereto. The first insulating part 42 and the second insulating parts 41a and 41b may be formed of a material selected from an epoxy molding compound (EMC), white silicone, photoimageable solder resist (PSR), a silicone resin composition, a modified epoxy resin composition such as a silicone modified epoxy resin or the like, a modified silicone resin composition such as an epoxy modified silicone resin or the like, a polyimide resin composition, a modified polyimide resin composition, and a resin such as polyphthalamide (PPA), a polycarbonate resin, polyphenylene sulfide (PPS), a liquid crystal polymer (LCP), an ABS resin, a phenol resin, an acrylic resin, a PBT resin, or the like.

According to the embodiment, since the second insulating parts 41a and 41b are disposed at lower edges of the body 10, it is possible to prevent the occurrence of burrs at the edges when the package is cut. Since the aluminum substrate is formed of a metal material, burrs may be easily generated during cutting. When the burrs are generated, since the lower surface 12 is not flat, mounting on a circuit board may be poor. Further, when the burrs are generated, since a thickness may become uneven and some regions may be lifted, measurement errors may occur. Since the second insulating parts 41a and 41b are made of an insulating material, the burrs may not be generated during cutting.

Inner surfaces of the first groove 14a and the second groove 14b may have roughness (not shown). When the inner surfaces of the first groove 14a and the second groove 14b are smooth, adhesive strength with the second insulating parts 41a and 41b may be weakened. Accordingly, in order to fix the second insulating parts 41a and 41b, the inner surfaces of the first groove 14a and the second groove 14b may form the roughness through surface treatment.

A thickness d1 of each of the second insulating parts 41a and 41b may be 50 µm to 150 µm. When the thickness is 50 µm or more, a sufficient thickness may be secured to prevent the occurrence of the burrs during the package cutting, and when the thickness is 150 µm or less, the second insulating parts 41a and 41b may be prevented from protruding from the lower surface 12 of the body 10.

A width W1 of each of the second insulating parts 41a and 41b may be 100 µm to 300 µm. When the width is 100 µm or more, the second insulating parts 41a and 41b may be sufficiently fixed to the first groove 14a and the second groove 14b, and when the width is 300 µm or less, the area where an electrode is mounted on the lower surface 12 of the body 10 may be secured.

According to the embodiment, a ratio of the thickness and width (d1:W1) of each of the second insulating parts 41a and 41b may be 1:1.5 to 1:6. That is, the width of each of the second insulating parts 41a and 41b may be greater than the thicknesses. When the ratio of the thickness and the width is satisfied, the second insulating parts 41a and 41b are sufficiently fixed to the first groove 14 to suppress the occurrence of the burrs.

The body 10 includes a third groove 19a disposed in a region where the lower surface 12a of the first conductive part 10a and the inner side surface S24 meet, a fourth groove 19b disposed in an edge region where the lower surface 12b of the second conductive part 10b and the inner side surface S14 meet, and a third insulating part 43 disposed at the third groove 19a and the fourth groove 19b. The third insulating part 43 may be disposed on the lower surface 12 of the body 10 to be connected to the second insulating parts 41a and 41b and the first insulating part 42.

The first to fourth grooves 14a, 14b, 19a, and 19b may be simultaneously formed. Further, the second insulating parts 41a and 41b and the third insulating part 43 may be formed by a single coating process. Accordingly, a material of the third insulating part 43 may be the same as that of the second insulating parts 41a and 41b, but is not limited thereto.

The lower surface 12a of the first conductive part 10a, the lower surface 12b of the second conductive part 10b, the lower surfaces of the second insulating parts 41a and 41b, and a lower surface of the third insulating part 43 may be coplanarly disposed. That is, the second insulating parts 41a and 41b and the third insulating part 43 do not protrude from the lower surface 12 of the body 10 and thus may form a flat surface as a whole. Accordingly, when the second insulating parts 41a and 41b and the third insulating part 43 are mounted on the circuit board, a defect rate may decrease and the thickness of the package may be reduced.

A thickness d2 of the third insulating part 43 may be 10 μm to 100 μm. When the thickness is 10 μm or more, the third insulating part 43 be sufficiently fixed to the second groove 19, and when the thickness is 100 μm or less, since a depth of the second groove 19 may be controlled to be low, a thickness of a region where the semiconductor device 100 is mounted may be secured. Since the region where the semiconductor device 100 is mounted is a region having the thinnest thickness among the body 10 due to forming of the cavity 11, it may be advantageous to form the depth of the second groove 19 as shallow as possible.

The thickness d1 of each of the second insulating parts 41a and 41b may be greater than the thickness d2 of the third insulating part 43. However, the present invention is not limited thereto, and the thickness d1 of each of the second insulating parts 41a and 41b may be the same as the thickness d2 of the third insulating part 43.

As described above, since the body 10 has conductivity, the lower surface 12a of the first conductive part and the lower surface 12b of the second conductive part may each have conductivity. In this case, the second insulating parts 41a and 41b may be disposed along the edges to surround the lower surface 12a of the first conductive part and the lower surface 12b of the second conductive part, and the third insulating part 43 may be disposed between the lower surface 12a of the first conductive part and the lower surface 12b of the second conductive part. Both ends of the third insulating part 43 may be come into contact with the second insulating parts 41a and 41b.

Referring to FIG. 4, a width W2 of the third insulating part 43 may be 300 μm to 700 μm. When the width is 300 μm or more, a short circuit may be prevented by sufficiently spacing electrode surfaces 12a and 12b, and when the width is 700 μm or less, a sufficient area where the electrode is mounted may be secured in the lower surface 12 of the body 10. Accordingly, the width W2 of the third insulating part 43 may be greater than the width W1 of each of the second insulating parts 41a and 41b.

The lower surface 12a of the first conductive part may be wider than the lower surface 12b of the second conductive part. An area ratio of the lower surface 12a of the first conductive part and the lower surface 12b of the second conductive part may be 1:0.2 to 1:0.6. When the area ratio is 1:0.2 or more, an area of the lower surface 12b of the second conductive part may be secured to prevent a short circuit, and when the area ratio is 1:0.6 or less, a space where a sub-mount is disposed may be secured on the lower surface 12a of the first conductive part.

A ratio (W1:W4) of the width W1 of a lower surface of the first groove and a width W4 of the lower surface of the first conductive part may be 1:3 to 1:5. When the ratio of the widths is 1:3 or more, the area of the lower surface 12a of the first conductive part increases and thus an area where the sub-mount is mounted may be secured, and when the ratio of the widths is 1:5 or less, the width of the second insulating part increases and thus the occurrence of the burrs may be effectively suppressed.

A ratio (W21:W4) of a width W21 of a lower surface of the third groove and the width W1 of the lower surface of the first groove may be 1:0.8 to 1:1.2. That is, the width W2 of the third insulating part 43 may be two or more times greater than the width W1 of each of the second insulating parts 41a and 41b. Accordingly, a short circuit may be prevented by sufficiently spacing the lower surfaces 12a and 12b of the first conductive part and the second conductive part.

Referring to FIG. 3A, the semiconductor device 100 may be disposed in the cavity 11. The semiconductor device 100 may be electrically connected to the first conductive part 10a and the second conductive part 10b. A sub-mount 22 may be disposed in the cavity 11, and the semiconductor device 100 may be disposed on the sub-mount 22. A pad part (not shown) to which a wire is bonded may be disposed at the bottom of the cavity 11.

The semiconductor device 100 may output light in an ultraviolet wavelength band. For example, the semiconductor device 100 may output light in a near ultraviolet wavelength band (ultraviolet (UV)-A), may output light in a far ultraviolet wavelength band (UV-B), and may output light in a deep ultraviolet wavelength band (UV-C). The wavelength range may be determined by a composition ratio of Al in a light emitting structure.

For example, the light in the near ultraviolet wavelength band (UV-A) may have a peak wavelength ranging from 320 nm to 420 nm, the light in the far ultraviolet wavelength band (UV-B) may have a peak wavelength ranging from 280 nm to 320 nm, and the light in the deep ultraviolet wavelength band (UV-C) may have a peak wavelength ranging from 100 nm to 280 nm.

The light transmission member 50 may be disposed on the cavity 11. The light transmission member 50 may be supported by the stepped portion 15 disposed between the first cavity 11a and the second cavity 11b. An adhesive layer (not shown) may be disposed between the stepped portion 15 and the light transmission member 50. When the adhesive layer is overfilled, the remaining adhesive may be recede into the recess 17. Accordingly, even when adhesive is excessively coated, horizontality of the light transmission member 50 may be maintained.

The light transmission member 50 is not particularly limited as long as it is a material capable of transmitting light in the ultraviolet wavelength band. For example, a transmission layer may include an optical material having a high UV wavelength transmittance such as quartz, but is not limited thereto.

Referring to FIGS. 3A and 3B, the second insulating parts 41a and 41b may overlap the stepped portion 15 in a vertical direction (a Y-axis direction) of the body 10. A width W12 in a first direction in which the second insulating parts 41a and 41b and the stepped portion 15 overlap may be 10% to 30% of the width W1 of each of the second insulating parts 41a and 41b in the first direction.

When the overlapping width W12 in the first direction is greater than 10% of the width W1 in the first direction, the width W1 of each of the second insulating parts 41a and 41b increases, and thus the second insulating parts 41a and 41b may be sufficiently fixed to the body 10, and when the overlapping width W12 in the first direction is 30% or less of the width W1 in the first direction, the width of each of the second insulating parts 41a and 41b decreases, and thus an area where the electrode is mounted on the lower surface 12 of the body 10 may be secured.

The second insulating parts 41a and 41b may not overlap the light transmission member 50 in the vertical direction (the Y-axis direction) of the body 10. A separation distance W13 between the second insulating parts 41a and 41b and the light transmission member 50 in the first direction may be 5% to 10% of the width W1 of each of the second insulating parts 41a and 41b in the first direction. When the separation distance W13 in the first direction is 5% or more of the width W1 in the first direction, the width of each of the second insulating parts 41a and 41b decreases so that the area where the electrode is mounted on the lower surface 12 of the body 10 may be secured. Further, when the separation distance W13 in the first direction is 10% or less, the second insulating parts 41a and 41b may be sufficiently fixed to the body 10.

The thickness d1 of each of the second insulating parts 41a and 41b may be 5% to 10% of a height of the body 10. When the thickness d1 of each of the second insulating parts 41a and 41b is 5% or more of the height of the body 10, a sufficient thickness may be secured to prevent the occurrence of the burrs when cutting the package, and when the thickness is 10% or less, it is possible to prevent the second insulating parts 41a and 41b from protruding from the lower surface of the body 10.

A vertical distance between the second insulating part 41a or 41b and the stepped portion 15 may be 50% to 70% of the total height of the body 10. When the vertical distance between the second insulating part 41a or 41b and the stepped part 15 is 50% or more of the total height of the body 10, a sufficient body height may be secured, and when the vertical distance between the second insulating part 41a or 41b and the stepped part 15 is 70% or less, a thickness of the second insulating part may be secured to prevent the occurrence of the burrs when cutting the package.

FIG. 5 is a cross-sectional view of a semiconductor device package according to a second embodiment of the present invention, and FIG. 6 is a cross-sectional view of a semiconductor device package according to a third embodiment of the present invention.

Referring to FIG. 5, a width of a cavity 11a may increase, and accordingly, a width of a light transmission member 50 may increase. According to this structure, an area of a semiconductor device 100 which may be disposed in the cavity may be increased. Accordingly, there is an advantage in that a large-area semiconductor device 100 may be mounted in the same package size.

According to this structure, second insulating parts 41a and 41b and the light transmission member 50 may overlap in a vertical direction. A width W14 in a first direction in which the second insulating parts 41a and 41b and the light transmission member 50 overlap may be 5% to 50% of the width of each of the second insulating parts 41a and 41b in the first direction. When the width W14 in the first direction in which the second insulating parts 41a and 41b and the light transmission member 50 overlap is 5% or more, areas of the second insulating parts 41a and 41b may be secured and the size of the light transmission member 50 may be increased. Further, when the width W14 in the first direction in which the second insulating parts 41a and 41b and the light transmission member 50 overlap is 50% or less, since a thickness of a body sidewall 16 that supports a side surface of the light transmission member 50 may be secured, it is possible to stably support the light transmission member 50.

Referring to FIG. 6, second insulating parts 41a and 41b and a stepped portion 15 may not overlap in a vertical direction. That is, the second insulating parts 41a and 41b and the stepped portion 15 may be spaced apart from each other by a predetermined interval. Accordingly, the second insulating parts 41a and 41b and a light transmission member 50 may not overlap in the vertical direction.

A distance W15 between the second insulating part 41a or 41b and the stepped portion 15 in the first direction may be 20% to 60% of the width of each of the second insulating parts 41a and 41b. When the distance W15 between the second insulating part 41a or 41b and the stepped portion 15 in the first direction is 20% or more of the width of each of the second insulating parts 41a and 41b, since the width of each of the second insulating parts 41a and 41b decreases, an area where an electrode is mounted on a lower portion of a body may be sufficiently secured. Further, when the distance W15 in the first direction is 60% or less of the width of each of the second insulating parts 41a and 41b, the width of each of the second insulating parts 41a and 41b may be secured to secure adhesion to a body 10.

FIG. 7 is a cross-sectional view of a semiconductor device package according to a fourth embodiment of the present invention, and FIG. 8 is a cross-sectional view of a semiconductor device package according to a fifth embodiment of the present invention.

Referring to FIG. 7, a light transmission member 50 may be directly disposed on an upper end of a body without forming a separate stepped portion in a cavity of the body. Second insulating parts 41a and 41b and the light transmission member 50 may overlap in a vertical direction. A width W14 in a first direction in which the second insulating parts 41a and 41b and the light transmission member 50 overlap may be 5% to 50% of the width of each of the second insulating parts 41a and 41b in the first direction. When the width W14 in the first direction in which the second insulating parts 41a and 41b and the light transmission member 50 overlap is 5% or more, areas of the second insulating parts 41a and 41b may be secured and the size of the light transmission member 50 may be increased. Further, when the width W14 in the first direction in which the second insulating parts 41a and 41b and the light transmission member 50 overlap is 50% or less, sufficient areas of the second insulating parts 41a and 41b may be secured.

Referring to FIG. 8, the second insulating parts 41a and 41b may not overlap the light transmission member 50 in the vertical direction (the Y-axis direction) of the body 10. A separation distance W13 between the second insulating parts 41a and 41b and the light transmission member 50 in the first direction may be 5% to 100% of the width W1 of each of the second insulating parts 41a and 41b in the first direction. When the separation distance W13 in the first direction is 5% or more of the width W1 in the first direction, the width of each of the second insulating parts 41a and 41b decreases so that the area where the electrode is mounted on the lower surface 12 of the body 10 may be secured. Further, when the separation distance W13 in the first direction is 100% or less, the width of each of the second insulating parts 41a and 41b increases so that the second insulating parts 41a and 41b may be sufficiently fixed to the body 10.

FIG. 9 is a cross-sectional view of a semiconductor device package according to a sixth embodiment of the present invention, FIG. 10 is a cross-sectional view of a semiconductor device package according to a seventh embodiment of the present invention, and FIG. 11 is a cross-sectional view of a semiconductor device package according to an eighth embodiment of the present invention.

Referring to FIG. 9, a first conductive part 10*a* of a body 10 may include a first lower conductive part 10*a*-1 and a first upper conductive part 10*a*-2, and a second conductive part 10*b* may include a second lower conductive part 10*b*-1 and a second upper conductive part 10*b*-2. Further, the body 10 may include fourth insulating parts 44 disposed between the first lower conductive part 10*a*-1 and the first upper conductive part 10*a*-2, and between the second lower conductive part 10*b*-1 and the second upper conductive part 10*b*-2, respectively.

The fourth insulating parts 44 may be made of an insulating material. For example, the fourth insulating parts 44 may include an acrylic adhesive material. This is because the fourth insulating parts 44 are formed in a low-temperature and low-pressure environment unlike second insulating parts 41*a* and 41*b*.

When the fourth insulating parts 44 are formed in a high-temperature and high-pressure environment like the second insulating parts 41*a* and 41*b*, defects may occur in a process of bonding to a relatively large area, and a phenomenon in which the second insulating parts 41*a* and 41*b* which are first formed break or crack due to the high-temperature and high-pressure environment may occur.

However, the present invention is not limited thereto, and the fourth insulating parts 44 may include an EMC, white silicone, a PSR, a silicone resin composition, a modified epoxy resin composition such as a silicone modified epoxy resin or the like, a modified silicone resin composition such as an epoxy modified silicone resin or the like, a polyimide resin composition, a modified polyimide resin composition, polyphthalamide (PPA), a polycarbonate resin, polyphenylene sulfide (PPS), a liquid crystal polymer (LCP), an ABS resin, a phenol resin, a PBT resin, and the like.

Compared to the second insulating parts 41*a* and 41*b*, in the fourth insulating parts 44, relatively, heat dissipation characteristics, for example, thermal conductivity may not be an important factor in selecting a material. Accordingly, the fourth insulating parts 44 may be made of a material having a lower thermal conductivity than the second insulating parts 41*a* and 41*b*, and accordingly, a wide selection range of materials may be formed.

The fourth insulating part 44 may suppress the occurrence of a short circuit between the first conductive part 10*a* and the second conductive part 10*b* due to poor soldering or the like when a light emitting device package is mounted. For example, even when a short circuit occurs between the first upper conductive part 10*a*-2 and the second upper conductive part 10*b*-2, the lower conductive part 10*a*-1 and the second lower conductive part 10*b*-1 on which the semiconductor device 100 is disposed may be electrically insulated by the fourth insulating parts 44.

A height H2 from a lower surface 12 of the body 10 to the fourth insulating part 44 may be higher than a height H1 from the lower surface 12 of the body 10 to the bottom surface 11*c* of the cavity. A ratio (H1:H2) of the height H1 from the lower surface 12 of the body 10 to the bottom surface 11*c* of the cavity and the height H2 from the lower surface 12 of the body 10 to the lower surface of the fourth insulating part 44 may be 1:1.09 to 1:1.72.

When the height ratio is 1:1.09 or more (for example, 1:1.10), even when foreign matter penetrates into the cavity during a package manufacturing process, insulation may be enhanced by securing an interval between a lower portion of the body 10 and an upper portion of the body 10. When the height ratio is 1:1.72 or less, since light directly emitted to the fourth insulating parts 44 may be reduced, cracks and the like of the fourth insulating part 44 due to the light may be prevented.

The second insulating parts 41*a* and 41*b* may overlap the stepped portion 15 in a vertical direction (a Y-axis direction) of the body 10. A width W12 in a first direction in which the second insulating parts 41*a* and 41*b* and the stepped portion 15 overlap may be 10% to 30% of the width W1 of each of the second insulating parts 41*a* and 41*b* in the first direction. When the overlapping width W12 in the first direction is greater than 10% of the width W1 in the first direction, the width W1 of each of the second insulating parts 41*a* and 41*b* increases, and thus the second insulating parts 41*a* and 41*b* may be sufficiently fixed to the body 10, and when the overlapping width W12 in the first direction is 30% or less of the width W1 in the first direction, the width of each of the second insulating parts 41*a* and 41*b* decreases, and thus an area where the electrode is mounted on the lower surface 12 of the body 10 may be secured.

The second insulating parts 41*a* and 41*b* may not overlap the light transmission member 50 in the vertical direction (the Y-axis direction) of the body 10. A separation distance W13 between the second insulating parts 41*a* and 41*b* and the light transmission member 50 in the first direction may be 5% to 10% of the width W1 of each of the second insulating parts 41*a* and 41*b* in the first direction. When the separation distance W13 in the first direction is 5% or more of the width W1 in the first direction, the width of each of the second insulating parts 41*a* and 41*b* decreases so that the area where the electrode is mounted on the lower surface 12 of the body 10 may be secured. Further, when the separation distance W13 in the first direction is 10% or less, the second insulating parts 41*a* and 41*b* may be sufficiently fixed to the body 10.

The thickness d1 of each of the second insulating parts 41*a* and 41*b* may be 5% to 10% of a height of the body 10. When the thickness d1 of each of the second insulating parts 41*a* and 41*b* is 5% or more of the height of the body 10, a sufficient thickness may be secured to prevent the occurrence of the burrs when cutting the package, and when the thickness is 10% or less, it is possible to prevent the second insulating parts 41*a* and 41*b* from protruding from the lower surface of the body 10.

A vertical distance H3 between the second insulating part 41*a* or 41*b* and the stepped portion 15 may be 50% to 70% of the total height of the body 10. When the vertical distance between the second insulating part 41*a* or 41*b* and the stepped part 15 is 50% or more of the total height of the body 10, a sufficient body height may be secured, and when the vertical distance between the second insulating part 41*a* or 41*b* and the stepped part 15 is 70% or less, a thickness of the second insulating part may be secured to prevent the occurrence of the burrs when cutting the package.

FIG. 10 is a cross-sectional view of the semiconductor device package according to the seventh embodiment of the present invention, and FIG. 11 is a cross-sectional view of the semiconductor device package according to the eighth embodiment of the present invention.

Referring to FIG. 10, an area of the cavity 11*a* may increase, and accordingly, an area of the light transmission member 50 may also increase. According to this structure, an area of the semiconductor device 100 which may be disposed in the cavity may be increased. Accordingly, there is an advantage in that a large-area semiconductor device 100 may be mounted in the same package size.

According to this structure, the second insulating parts 41*a* and 41*b* and the light transmission member 50 may overlap in the vertical direction. A width W14 in the first direction in which the second insulating parts 41a and 41b and the stepped portion 15 overlap may be 5% to 50% of the width of each of the second insulating parts 41a and 41b in the first direction. When the width W14 in the first direction in which the second insulating parts 41a and 41b and the light transmission member 50 overlap is 5% or more, areas of the second insulating parts 41a and 41b may be secured and the size of the light transmission member 50 may be increased. Further, when the width W14 in the first direction in which the second insulating parts 41a and 41b and the light transmission member 50 overlap is 50% or less, since a thickness of a body sidewall 16 that supports a side surface of the light transmission member 50 may be secured, it is possible to stably support the light transmission member 50.

Referring to FIG. 11, the second insulating parts 41a and 41b and the stepped portion 15 may not overlap in the vertical direction. That is, the second insulating parts 41a and 41b and the stepped portion 15 may be spaced apart from each other by a predetermined interval. A separation distance W15 between the second insulating part 41a or 41b and the stepped portion 15 in the first direction may be 20% to 60% of the width of each of the second insulating parts 41a and 41b. When the separation distance W15 between the second insulating part 41a or 41b and the stepped portion 15 in the first direction is 20% or more of the width of each of the second insulating parts 41a and 41b, since the width of each of the second insulating parts 41a and 41b decreases, an area where the electrode is mounted on the lower portion of the body may be sufficiently secured. Further, when the separation distance W15 in the first direction is 60% or less of the width of each of the second insulating parts 41a and 41b, the width of each of the second insulating parts 41a and 41b may be secured to secure adhesion to the body 10.

FIG. 12 is a conceptual diagram of a semiconductor device, and FIG. 13 is a modified example of FIG. 12.

Referring to FIG. 12, the semiconductor device 100 according to the embodiment may be mounted on a sub-mount 22 like a flip chip. That is, a first electrode 152 and a second electrode 151 of the semiconductor device 100 may be mounted on a first pad 23a and a second pad 23b of the sub-mount 22 in flip chip forms. In this case, the first pad 23a and the second pad 23b may be respectively soldered to the body 10 by a wire W.

However, a method of mounting the semiconductor device 100 is not specifically limited. For example, as shown in FIG. 13, a substrate 110 of the semiconductor device may be disposed on the sub-mount 22 and the first electrode 152 and the second electrode 151 may be directly soldered to the body 10.

The semiconductor device according to the embodiment may include the substrate 110, a first conductive semiconductor layer 120, an active layer 130, and a second conductive semiconductor layer 140. Each semiconductor layer may have an aluminum composition to emit light in the ultraviolet wavelength band.

The substrate 110 includes a conductive substrate or an insulating substrate. The substrate 110 may be a material suitable for semiconductor material growth or a carrier wafer. The substrate 110 may be formed of a material selected from sapphire ($Al_2O_3$), SiC, GaAs, GaN, ZnO, Si, GaP, InP, and Ge, but is not limited thereto. The substrate 110 may be removed as necessary.

A buffer layer (not shown) may be further provided between the first conductive semiconductor layer 120 and the substrate 110. The buffer layer may alleviate a lattice mismatch between a light emitting structure 160 provided on the substrate 110 and the substrate 110.

The first conductive semiconductor layer 120 may be implemented with a group III-V or II-VI compound semiconductor, and may be doped with a first dopant. The first conductive semiconductor layer 120 may be selected from semiconductor materials having a composition formula of $In_{x1}Al_{y1}Ga_{1-x1-y1}N$ (x1 is 0 to 1, y1 is 0 to 1, and x1+y1 is 0 to 1), for example, GaN, AlGaN, InGaN, InAlGaN, and the like. Further, the first dopant may be an n-type dopant such as Si, Ge, Sn, Se, and Te. When the first dopant is an n-type dopant, the first conductive semiconductor layer 120 doped with the first dopant may be an n-type semiconductor layer.

The active layer 130 is a layer in which electrons (or holes) injected through the first conductive semiconductor layer 120 and holes (or electrons) injected through the second conductive semiconductor layer 140 meet. The active layer 130 transitions to a low energy level due to recombination of the electrons and the holes, and may generate light having a wavelength corresponding thereto.

The active layer 130 may have one structure among a single well structure, a multiple well structure, a single quantum well structure, a multi quantum well (MQW) structure, a quantum dot structure, and a quantum wire structure, and the structure of the active layer 130 is not limited thereto.

The second conductive semiconductor layer 140 may be formed on the active layer 130, may be implemented with a group III-V or II-VI compound semiconductor, and may be doped with a second dopant. The second conductive semiconductor layer 140 may be selected from a semiconductor material having a composition formula of $In_{x5}Al_{y2}Ga_{1-x5-y2}N$ (x5 is 0 to 1, y2 is 0 to 1, and x5+y2 is 0 to 1), or a material selected from AlInN, AlGaAs, GaP, GaAs, GaAsP, and AlGaInP. When the second dopant is a p-type dopant such as Mg, Zn, Ca, Sr, Ba, or the like, the second conductive semiconductor layer 140 doped with the second dopant may be a p-type semiconductor layer.

The first electrode 152 may be electrically connected to the first conductive semiconductor layer 120, and the second electrode 151 may be electrically connected to the second conductive semiconductor layer 140. The first and second electrodes 152 and 151 may be selected from Ti, Ru, Rh, Ir, Mg, Zn, Al, In, Ta, Pd, Co, Ni, Si, Ge, Ag, and Au, and a selective alloy thereof.

In the embodiment, a structure of a horizontal light emitting device is described, but the present invention is not limited thereto. For example, the light emitting device according to the embodiment may have a vertical structure or flip chip structure.

The semiconductor device package may be applied to various types of light source devices. For example, the light source device may be a concept including a sterilization device, a curing device, a lighting device, a display device, a vehicle lamp, and the like. That is, the semiconductor device may be applied to various electronic devices disposed in a case to provide light.

The sterilization device may sterilize a desired region by including the semiconductor device according to the embodiment. The sterilization device may be applied to household appliances such as a water purifier, an air conditioner, a refrigerator, and the like, but is not limited thereto. That is, the sterilization device may be applied to all products (for example, a medical device) which require sterilization.

For example, the water purifier may be provided with the sterilization device according to the embodiment to sterilize circulating water. The sterilization device is disposed in a nozzle or an outlet through which the water circulates to irradiate ultraviolet rays. In this case, the sterilization device may include a waterproof structure.

The curing device may cure various types of liquid by including the semiconductor device according to the embodiment. The liquid may be the broadest concept including all of the various materials which are cured when irradiated with ultraviolet rays. For example, the curing device may cure various types of resins. Alternatively, the curing device may be applied to cure cosmetic products such as a manicure.

The lighting device may include a light source module including a substrate and the semiconductor device of the embodiment, a heat dissipation part which dissipates heat from the light source module, and a power supply part which processes or converts an electrical signal provided from the outside to provide the electrical signal to the light source module. Further, the lighting device may include a lamp, a head lamp, a street light, or the like.

The display device may include a bottom cover, a reflective plate, a light emitting module, a light guide plate, an optical sheet, a display panel, an image signal output circuit, and a color filter. The bottom cover, the reflection plate, the light emitting module, the light guide plate, and the optical sheet may constitute a backlight unit.

The reflective plate may be disposed on the bottom cover, and the light emitting module may emit light. The light guide plate is disposed in front of the reflection plate to guide the light emitted from the light emitting module to the front, and the optical sheet may include a prism sheet and the like, and may be disposed in front of the light guide plate. The display panel may be disposed in front of the optical sheet, the image signal output circuit may supply an image signal to the display panel, and the color filter may be disposed in front of the display panel.

The semiconductor device package may be used as an edge type backlight unit or a direct type backlight unit when used as the backlight unit of the display device.

Although the above-described embodiments are mainly described with reference to the embodiments of the present invention, the above are only exemplary, and it should be understood that those skilled in the art may variously perform modifications and applications within the principle of the embodiments. For example, elements specifically shown in the embodiments may be modified. Further, differences related to modifications and changes should be understood as being included in the scope of the present invention defined in the appended claims.

The invention claimed is:

1. A semiconductor device package comprising:
a body including a cavity;
a semiconductor device disposed in the cavity; and
a light transmission member disposed on the cavity,
wherein the body includes a first conductive part and a second conductive part disposed to be spaced apart from each other in a first direction, a first insulating part disposed between the first conductive part and the second conductive part, and a second insulating part disposed in an edge region where a lower surface and side surfaces of the body meet,
wherein the cavity includes a stepped portion on which the light transmission member is disposed,
wherein the second insulating part overlaps the stepped portion in a vertical direction of the body, and
wherein the second insulating part does not overlap the light transmission member in the vertical direction.

2. The semiconductor device package of claim 1, wherein a width in the first direction in which the second insulating part and the stepped portion overlap each other is 10% to 30% of a width of the second insulating part in the first direction.

3. The semiconductor device package of claim 1, wherein a separation distance between the second insulating part and the light transmission member in the first direction is 5% to 10% of a width of the second insulating part in the first direction.

4. The semiconductor device package of claim 1, wherein a vertical distance between the second insulating part and the stepped portion is 50% to 70% of a total height of the body.

5. The semiconductor device package of claim 1, wherein a lower surface of the first conductive part is wider than a lower surface of the second conductive part.

6. The semiconductor device package of claim 1, wherein a thickness of the second insulating part is 5% to 10% of a total height of the body.

7. The semiconductor device package of claim 1, wherein:
the semiconductor device emits light in an ultraviolet wavelength band; and
the first conductive part and the second conductive part reflect the light in the ultraviolet wavelength band.

8. The semiconductor device package of claim 1, wherein the second insulating part overlaps the light transmission member in the vertical direction.

9. The semiconductor device package of claim 1, wherein:
the first conductive part includes a first lower conductive part and a first upper conductive part;
the second conductive part includes a second lower conductive part and a second upper conductive part; and
the body includes fourth insulating parts disposed between the first lower conductive part and the first upper conductive part, and between the second lower conductive part and the second upper conductive part.

10. The semiconductor device package of claim 9, wherein the fourth insulating part has a lower thermal conductivity than the second insulating part.

11. The semiconductor device package of claim 9, wherein a vertical distance from the lower surface of the body to the fourth insulating part is greater than a vertical distance from the lower surface of the body to a bottom surface of the cavity.

12. The semiconductor device package of claim 11, wherein a ratio of the vertical distance from the lower surface of the body to the bottom surface of the cavity and the vertical distance from the lower surface of the body to the fourth insulating part is 1:1.09 to 1:1.72.

13. A semiconductor device package comprising:
a body including a cavity;
a semiconductor device disposed in the cavity; and
a light transmission member disposed on the cavity,
wherein the body includes a first conductive part and a second conductive part disposed to be spaced apart from each other in a first direction, a first insulating part disposed between the first conductive part and the second conductive part, and a second insulating part disposed in an edge region where a lower surface and side surfaces of the body meet,
wherein the cavity includes a stepped portion on which the light transmission member is disposed,
wherein the second insulating part overlaps the stepped portion in a vertical direction of the body,
wherein the second insulating part overlaps the light transmission member in the vertical direction, and wherein a width in the first direction in which the second insulating part and the light transmission member overlap each other is 5% to 50% of a width of the second insulating part in the first direction.

14. The semiconductor device package of claim 13, wherein:
the first conductive part includes a first lower conductive part and a first upper conductive part;
the second conductive part includes a second lower conductive part and a second upper conductive part; and
the body includes fourth insulating parts disposed between the first lower conductive part and the first upper conductive part, and between the second lower conductive part and the second upper conductive part.

15. The semiconductor device package of claim 14, wherein a vertical distance from the lower surface of the body to the fourth insulating part is greater than a vertical distance from the lower surface of the body to a bottom surface of the cavity.

16. A semiconductor device package comprising:
a body including a cavity;
a semiconductor device disposed in the cavity; and
a light transmission member disposed on the cavity,
wherein the body includes a first conductive part and a second conductive part disposed to be spaced apart from each other in a first direction, a first insulating part disposed between the first conductive part and the second conductive part, and a second insulating part disposed in an edge region where a lower surface and side surfaces of the body meet,
wherein the first conductive part includes a first lower conductive part and a first upper conductive part,
wherein the second conductive part includes a second lower conductive part and a second upper conductive part, and
wherein the body includes fourth insulating parts disposed between the first lower conductive part and the first upper conductive part, and between the second lower conductive part and the second upper conductive part.

17. The semiconductor device package of claim 16, wherein the fourth insulating part has a lower thermal conductivity than the second insulating part.

18. The semiconductor device package of claim 16, wherein:
the semiconductor device emits light in an ultraviolet wavelength band; and
the first conductive part and the second conductive part reflect the light in the ultraviolet wavelength band.

19. The semiconductor device package of claim 16, wherein a vertical distance from the lower surface of the body to the fourth insulating part is greater than a vertical distance from the lower surface of the body to a bottom surface of the cavity.

20. The semiconductor device package of claim 19, wherein a ratio of the vertical distance from the lower surface of the body to the bottom surface of the cavity and the vertical distance from the lower surface of the body to the fourth insulating part is 1:1.09 to 1:1.72.

* * * * *